United States Patent [19]

Baker

[11] 4,152,777
[45] May 1, 1979

[54] ON CHIP BUFFERING FOR OPTIMIZING PERFORMANCE OF A BUBBLE MEMORY

[75] Inventor: David M. Baker, Poway, Calif.

[73] Assignee: Burroughs Corporation, Detroit, Mich.

[21] Appl. No.: 853,382

[22] Filed: Nov. 21, 1977

[51] Int. Cl.² .................................................. G11C 19/08
[52] U.S. Cl. ........................................ 365/15; 365/12; 365/17
[58] Field of Search .............................. 365/15, 17, 12

[56] References Cited

U.S. PATENT DOCUMENTS 4,056,812  11/1977  Bobeck et al. .................... 365/15

Primary Examiner—James W. Moffitt
Attorney, Agent, or Firm—Joseph R. Dwyer; Mervyn L. Young; Kevin R. Peterson

[57] ABSTRACT

In a bubble memory system having storage loop architecture, means for buffering both read and write requests in order to improve performance including, in the embodiment disclosed, two sets of short or buffer loops, one for the write section and one for the read section, which are virtually asynchronous with respect to each other and to the main memory storage loops and in which data may be temporarily stored prior to transfer into the main storage loops or prior to transfer into an output track.

8 Claims, 1 Drawing Figure

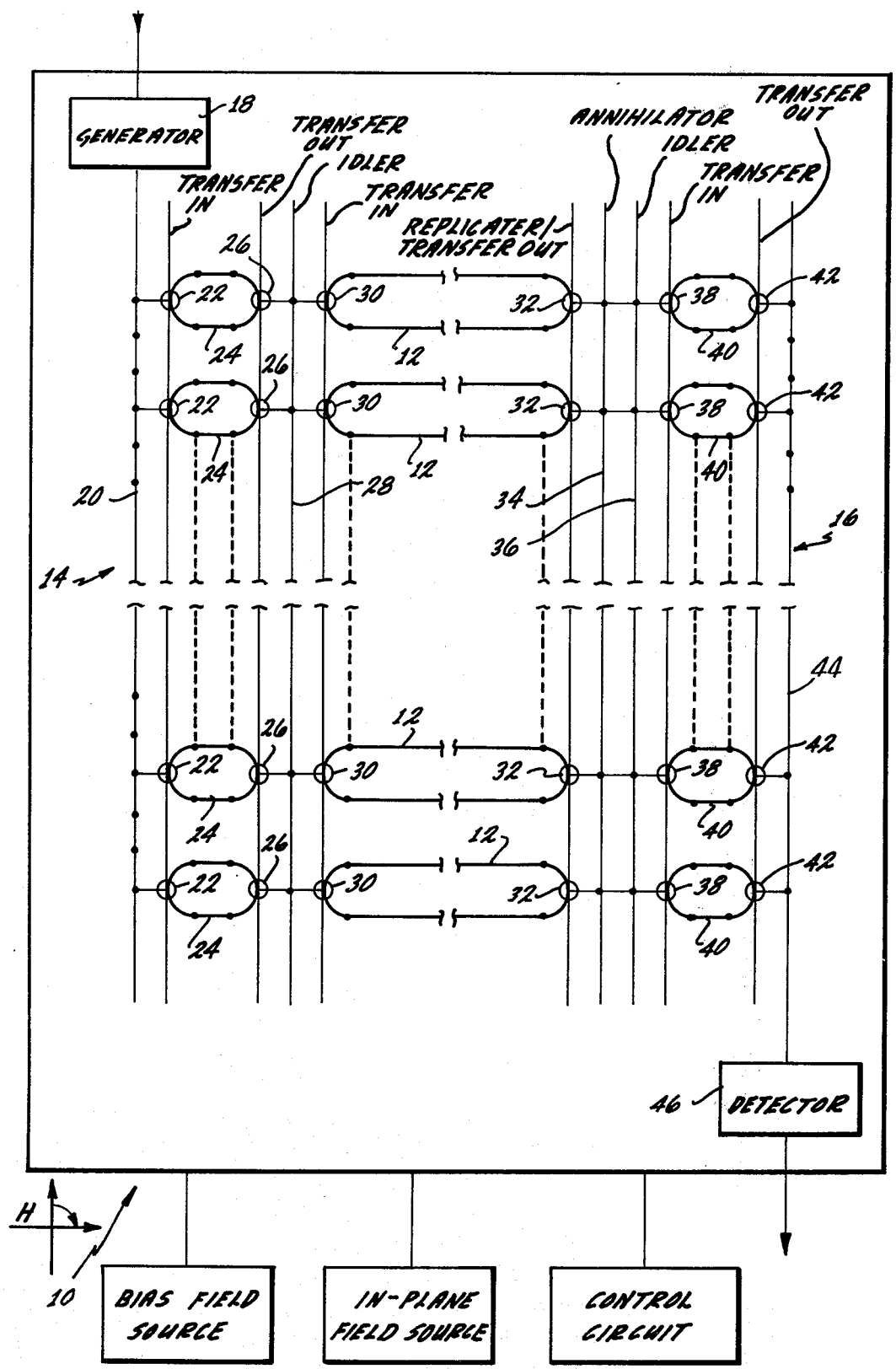

ON CHIP BUFFERING FOR OPTIMIZING PERFORMANCE OF A BUBBLE MEMORY

RELATED INVENTIONS

This application relates to an application entitled, "Asynchronous Storage Loop Type Bubble Chip Architecture", by the same inventor, David M. Baker, Ser. No. 854,408 filed Nov. 21, 1977 and assigned to the same assignee.

BACKGROUND OF THE INVENTION

1. Field of the Invention

This invention relates to bubble (magnetic domain) memories and more particularly to a storage loop bubble memory organization with means for buffering addressed data from both read and write requests and for storing data prior to transfer into the main memory storage loops or prior to transfer out of the main memory storage loops.

2. Prior Art

Bubble memories on which conditions exist for establishing single wall domains on a suitable magnetic material such as an epitaxial magnetic garnet film on a nonmagnetic substrate are well known. Magnetically soft overlay material in the form of propagate elements are typically arranged in a series of identical storage loops forming a memory organization in which bubbles propagate from one propagate element to another around these loops by the action of an in-plane rotating magnetic field. And in this arrangement, transfer gates forming part of a write-in means and a read-out means transfer bubbles to and from these loops. Typically, on command, bubbles will be transferred in parallel into the storage loops from an input track and also on command bubbles will be transferred from the storage loops to an output track where they are then serially detected as they are propagated through a sensor which detects the presence or absence of a bubble and generates a signal as a binary "1" or a binary "0" data bit.

Although the bubble memory systems employing the storage loops of the type described have numerous economic and operational advantages, there are major shortcomings in the systems. This was pointed out in the co-pending application by the same inventor, supra, where it was shown that the write-in means and the read-out means could be decoupled from the cyclic propagation cycles of the storage loops in order to improve the steady state random access performance of the bubble memory. This was accomplished by providing idlers between the input track and the transfer-in gates in the write-in section of the memory and between the annihilator and the output track in the read-out section. Thus, blocks of data bits awaiting transfer into the storage loops or onto the output track could be held until the appropriate time for transfer leaving the input track and the output track free to transfer a block of data bits independently of each other and of the position of the blocks of bits in the storage loops.

In the present invention, in addition to the aforesaid idlers, the memory system is further improved by providing additional short or buffer storage loops between the input track and the idler in the write-in section and in the read-out section between the idler and the output track; one short or buffer storage loop for each large or main memory storage loop. Thus, these buffer loops are virtually asynchronous in operation with respect to each other and to the main memory storage loops and data can thus be temporarily stored in the buffer loops prior to transfer into the main storage loops and prior to transfer into the output track.

The buffer loops make it possible to store a number of data blocks, typically five to eight, and transfer them to or from the long storage loops as their respective positions come to the transfer gates. Write and read operations can occur simultaneously. The propagation cycles required to serially transfer in or out also causes data to propagate in both the long storage loops and the short or buffer loops. Thus, during high steady state random access periods, the latency time required to position blocks in the long storage loops is completely masked by the serial propagation of data on the input and output tracks.

Accordingly, it is an object of this invention to optimize performance of a bubble memory storage loop organization by providing on chip buffering of data.

SUMMARY OF THE INVENTION

According to the present invention the magnetic domain memory architecture comprises a plurality of main storage loops disposed between a write-in section and a read-out section. In the write-in section, the write-in means comprises a means for generating bits (domains or voids) and propagating said bits onto an input track position adjacent short or buffer storage loops and gate means for transferring said bits into and out of the buffer storage loops as a block of data bits, an idler to receive and hold said block of data bits transferred from the buffer loops and transfer-in gate means for transferring said block of bits received from the idler to the main storage loops. In the read-out section, the read-out means comprises transfer-out gate means for transferring blocks of data bits from the main storage loops, an annihilator and a second idler to receive the transferred-out block of bits not annihilated and transfer-in gate means for transferring the block of bits from the idler into a second set of buffer loops, transfer-out gate means for transferring a block of data bits from said buffer loops onto an output track to which is connected a sensor for detecting domains serially. The read-out section may also possibly include a replicator.

BRIEF DESCRIPTION OF THE DRAWINGS

FIG. 1 is a plan view of a magnetic domain memory arranged for on chip buffering in accordance with the teachings of this invention.

BRIEF DESCRIPTION OF THE PREFERRED EMBODIMENT

In FIG. 1 it can be seen that there is disclosed a bubble memory organization as a part of chip 10 on which conditions exist for establishing single wall domains on a suitable magnetic material such as an epitaxial magnetic garnet film on a nonmagnetic substrate; all of which are well known in the art.

Patterns of magnetically soft overlay material form propagate elements for the propagation of domains in response to a rotating in-plane magnetic field.

A series of identical main memory storage loops formed of these propagate elements (four loops are shown and all identified as 12) are stacked or aligned (vertically as shown in the drawings). These main loops form the main memory section of the chip and are located between a write section 14 and a read section 16.

Located in the write section 16 is a write-in means comprising a generator 18, an input track 20, buffer transfer-in gates 22, a plurality of short of buffer storage loops 24, equal in number to the main storage loops, buffer transfer-out gates 26, an idler 28, and main transfer-in gates 30 to service the main storage loops.

Located in the read section 16 is a read-out means which comprises the main transfer-out gates 32 to service the main storage loops and which may include a replicator, an annihilator 34, an idler 36, buffer transfer-in gates 38, a plurality of buffer storage loops 40, equal in number to the main storage loops, buffer transfer-out gates 42 servicing these buffer loops and an output track 44 to which is connected a detector 46 for serially detecting bubbles or the absence of bubbles transferred along the output track and through the detector. There is one transfer-in and one transfer-out gate for each buffer loop and for each main storage loop.

Each loop, both buffer and main storage loops, closes on itself so that bubbles established in the loops, in time, circulate by propagating from element to element indefinitely in response to the rotating in-plane magnetic field unless transferred out.

Also suitable bias sources, control circuits, including auxilliary circuits such as pulsing circuits for the application of pulses to the generator, to the transfer gates, the annihilator idlers, etc., are well known and shown herein only by block diagrams.

The generator 18 located at the entrance to the input track 20 generates bubble domains to be transferred serially along the input track 20. Again, in a positive logic system, for example, a bubble, or the absence of a bubble (a void), represents a binary "1" or a binary "0" bit, respectively, and there is one bit position in the input track for each of the buffer loops.

In order to understand and more fully appreciate the invention herein disclosed and claimed, consider first a typical storage loop organization of this type and omitting the operation of the buffer loops and the idler, typically, the input track is located adjacent the transfer-in gates to the main storage loops and when the first bit of a block of bits, whether a domain or a void, reaches its position opposite the gate to the lower main storage loop, normally a pulse on the conductor operatively connected to the gates will transfer the bits in parallel as a block into all of the main storage loops. Thus, circulating in the storage loops are blocks of bits representing stored binary information; one propagate element for each bit whether a bubble or a void. Also omitting consideration of the output buffer storage loops and the idlers, when it is desired to read data from memory, one block of bits is first transferred through the transfer-out gates by a transfer pulse on a conductor operatively connected to the gates. These gates may be combined replicate and transfer-out gates, and the first portion of the replicated bits will remain in the respective main storage loops and the other portion of the replicated bits will be transferred onto the output track. Thus, a replica block of bits, if desired, is transferred out of the main storage loops while the original block remains in the main storage loops and is continually recirculated. This way information is not destroyed in the memory. On the other hand, if it is desired to erase a block of data bits, the replicate function of the transfer-out gates is not implemented and the original block is transferred to an annihilator or to a swap gate and the block annihilated leaving the position for an additional block of information to be written into the main storage loops.

If a block of bits is transferred onto the output track, successive pulses transfer the bits along the output track to the detector which senses and translates the bits into electrical signals representing binary "1's" and binary "0's" to be sent to a utilization device.

Thus, in the typical operation of a storage loop memory organization of the prior art, there are certain things that should be noted at this time.

First, while the normal configuration of a prior art storage loop organization is to have the input track and the output track adjacent the main storage loops, it must be recognized that, before the generator such as 18 can be utilized to generate data bits, all of the data bits of the prior block of bits must be transferred serially into position and transferred into the main storage loops before the next block of bits can be generated and transferred along the track such as 20. Also, the timing of the transfer must be such that the block position of the main storage loops is precisely located at the transfer gates at the appropriate time to correctly receive the block to be entered from the input track. This means that the data buffer or register of the host system must hold the block of data bits before the generator performs the next write function. This may be several cycles of the main storage loops before the write-in step is synchronized to transfer the block of bits into the loops. Thus, access time into the memory is slowed in this organization. Similarly, in order for the data bits to be read out onto an output track, such as 44, all of the prior block of data bits on track 44 must be cleared before the next block can be transferred onto the track. This means that the bits to be transferred must wait until all of the data bits are out of the output track 44 and must wait until they are in the precise position adjacent the transfer-out gates before being transferred and/or replicated, as the case may be. This may take several cycles about the loop before reaching the transfer gates at the appropriate time. Again, this synchronization means a delay in the access from the memory.

In the co-pending application by the same inventor, supra, this long access synchronization problem which existed in the prior art as overcome by the introduction of idlers between the input track and the main storage loops in the write section and before the output track in the read section. The purpose was to decouple the write-in means and the write-out means from the propagate cycles of the main storage loops and thus make them independently operable so that data circulating in the loops was asynchronous to the write-in means and the read-out means. Thus arranged, data transferred into the idlers would remain idling until transferred or allowed to be transferred out by the rotating field into the main storage loops or onto the output track, as the case may be.

While the invention disclosed and claimed in the foregoing co-pending application improved the access time of bubble memory organizations, this invention teaches that the access time and the coordination with the host computer system can be still further improved by buffering or queueing the data addressed by several read or write requests without awaiting the long loop cycle time of the main memory storage loops.

In this embodiment of the invention, the series of buffer loops 24 in the write section 14 and buffer loops 40 in the read-out section 16, having short loop cycle times, effectively decouple the write section and the read section from the loop cycles of the main storage loops. The significance of this can be appreciated when it is realized that the short loops have only a few bit positions as compared to the memory storage loops which have several hundred bit positions. Thus, the buffer loops make it possible to store a number of data blocks, typically five to eight, (six bit positions being shown in the drawing) and transfer them to or from the main storage loops as their respective positions come to the transfer gates. These buffer loops, taken together with the idlers 28 and 36, which can hold data bits to and from the main storage loops, improve the access performance of the memory. While the propagation cycles required to serially transfer in or out also cause data to propagate in the long main storage loops and the short buffer loops, the latency time required to position blocks in the main storage loop is completely masked by the serial propagation of data on the input and output tracks. Thus, not only may a block of data bits be generated and transferred serially along the input track independently of the block positions in the main storage loops, but they also may be transferred independently of the buffer loops. Similarly, data blocks may be read out serially from the output track not only independently of the data being written in along the input track but also independently of the loop cycle times of the main storage loops as well as the loop cycle times of the buffer loops. This permits several data blocks addressed by read or write instructions from a host system to be serviced leaving the host system free to perform other functions.

WHAT IS CLAIMED IS:

1. A bubble memory system having an in-plane rotating magnetic field for bubble propagation comprising:
   a plurality of main storage loop means formed of propagate elements for supporting and propagating bubble domains from element to element responsive to the rotation of said in-plane magnetic field, and having a loop cycle time depending on the number of elements in each loop means, each loop means having an equal number of elements, and a bubble or the absence of a bubble constituting bits of binary information circulating in said main storage loop means,
   a write section and a read section operatively located with respect to said main storage loop means for writing bits into said main storage loop means and for reading bits out of said main storage loop means,
   the write section comprising means generating bits, means for propagating said bits serially responsive to said in-plane magnetic field to provide one bit for each main storage loop means, and transfer-in means for transferring said bits in parallel into said main storage loop means, and a plurality of buffer loop means for receiving said bit sin parallel from said propagating means, said buffer loop means being equal in number to the number of main storage loop means and formed of propagate elements for supporting and propagating domains from element to element, the loop cycle time of said buffer loop means being less than the loop cycle time of said main storage loop means,
   the read section comprising transfer-out means for transferring bits in parallel from said main storage loop means and for receiving and propagating said bits in response to said in-plane magnetic field to a detector means for serially detecting bits therein, and a plurality of buffer loop means between said transfer-out means and said means for receiving said bits in parallel and propagating said bits, said buffer loop means being equal in number to the number of main storage loop means and formed of propagate elements for supporting and propagating bubble domains from element to element in response to the rotation of said in-plane magnetic field, the loop cycle time of said buffer loop means being less than the loop cycle time of said main storage loop means.

2. The bubble memory system as claimed in claim 1 wherein the number of propagate elements in said buffer loop means is less than the number of propagate elements in said main storage loop means.

3. The bubble memory system as claimed in claim 2 further including idler means in said write section and in said read section.

4. The bubble memory system as claimed in claim 3 further including means for annihilating said bits located between said transfer-out means and said idler means for erasing unwanted bits transferred out by said transfer-out means.

5. The bubble memory system as claimed in claim 4 wherein said transfer-out means further includes a replicator.

6. A magnetic domain memory comprising:
   a domain propagation structure including magnetic propagation elements disposed in an arrangement on which magnetic domains propagate in response to a rotating in-plane magnetic field,
   the arrangement including a plurality of main storage loops of equal domain capacity,
   a write section and read section disposed respectively on each side of the storage loops with a plurality of buffer loops and equal domain capacity,
   said write section further including a first track means having a domain capacity to accommodate one domain for each buffer storage loop,
   and means for generating domains thereon for propagation along said first track, transfer-in and transfer-out gate means for transferring domains into and out of said buffer storage loops in parallel, and transfer-in gate means for transferring domains into said main storage loops in parallel from said buffer storage loops,
   said read-out section further including a transfer-out gate means for transferring said domains in parallel out of said main storage loops, transfer-in and transfer-out gate means for transferring domains into and out of said buffer storage loops in parallel, and a second track for receiving and propagating said domains and having a domain capacity to accommodate said domains being transferred from said buffer storage loops in parallel, and sensor means for receiving and converting said domains into electrical signals as they are transferred out serially from said second track means.

7. The magnetic domain memory as claimed in claim 6 further including idler means between said buffer storage loops and said main storage loops for receiving domains in parallel and holding same for a predetermined period before transfer out.

8. The magnetic domain memory as claimed in claim 7 wherein said buffer storage loops have less domain capacity than said main storage loops.

* * * * *